(12) United States Patent
Yamamoto (10) Patent No.: US 9,558,844 B2
(45) Date of Patent: Jan. 31, 2017

(54) IDENTIFYING STACKED DICE (71) Applicant: Micron Technology, Inc., Boise, ID (US)

(72) Inventor: Tadashi Yamamoto, Tsukuba (JP)

(73) Assignee: Micron Technology, Inc., Boise, ID (US)

(*) Notice: Subject to any disclaimer, the term of this patent is extended or adjusted under 35 U.S.C. 154(b) by 10 days.

(21) Appl. No.: 14/553,579

(22) Filed: Nov. 25, 2014

(65) Prior Publication Data
US 2015/0085968 A1  Mar. 26, 2015

Related U.S. Application Data (63) Continuation of application No. 13/748,256, filed on Jan. 23, 2013, now Pat. No. 8,902,680.

(51) Int. Cl.
G11C 7/00 (2006.01)
G11C 19/28 (2006.01)
G11C 19/00 (2006.01)
G11C 7/10 (2006.01)
G11C 8/12 (2006.01)
G11C 7/22 (2006.01)
G11C 15/00 (2006.01)
H01L 27/10 (2006.01)
H01L 25/065 (2006.01)
G11C 29/44 (2006.01)

(52) U.S. Cl.
CPC ........... *G11C 19/287* (2013.01); *G11C 7/1006* (2013.01); *G11C 7/1051* (2013.01); *G11C 7/1078* (2013.01); *G11C 7/22* (2013.01); *G11C 8/12* (2013.01); *G11C 15/00* (2013.01); *G11C 19/00* (2013.01); *H01L 27/10* (2013.01); *G11C 2029/4402* (2013.01); *H01L 25/0657* (2013.01); *H01L 2224/0557* (2013.01); *H01L 2224/06181* (2013.01); *H01L 2224/16145* (2013.01); *H01L 2225/06513* (2013.01); *H01L 2225/06541* (2013.01)

(58) Field of Classification Search
CPC ....... G11C 7/1006; G11C 7/22; G11C 7/1051; G11C 7/1078; G11C 8/12
USPC .......... 365/189.12, 51, 63, 78, 129, 189.17,365/189.05, 230.01
See application file for complete search history.

(56) References Cited

U.S. PATENT DOCUMENTS

| | | | |
|---|---|---|---|
| 7,711,059 | B2 | 5/2010 | Yeh et al. |
| 8,120,958 | B2 | 2/2012 | Bilger et al. |
| 8,902,680 | B2 | 12/2014 | Yamamoto |
| 2010/0259296 | A1 | 10/2010 | Or-Bach |
| 2011/0050320 | A1 | 3/2011 | Gillingham |
| 2011/0093735 | A1 | 4/2011 | Yoko et al. |

(Continued)

*Primary Examiner* — Fernando Hidalgo
(74) *Attorney, Agent, or Firm* — Schwegman Lundberg & Woessner, P.A.

(57) ABSTRACT

Various embodiments comprise apparatuses to assign unique device identifier values to addressable devices in a stacked package. In one embodiment, an apparatus is disclosed including a stacked package with at least two addressable devices. Each of the addressable devices includes data input and switch path circuitry, a shift register coupled to the data input and switch path circuitry, and a single through-substrate via (TSV) through which the unique device identifier values can be assigned. The single TSV is coupled to the data input and switch path circuitry and between adjacent ones of the at least two addressable devices. Additional apparatuses, systems, and methods are described.

18 Claims, 6 Drawing Sheets (56) References Cited

U.S. PATENT DOCUMENTS

2011/0164891 A1    7/2011   Miyake
2012/0051113 A1    3/2012   Choi et al.
2014/0205056 A1    7/2014   Yamamoto

FIG. 6 though only a single TSV,

IDENTIFYING STACKED DICE

PRIORITY APPLICATION

This application is a continuation of U.S. application Ser. No. 13/748,256, filed Jan. 23, 2013, issued as U.S. Pat. No. 8,902,680, which is incorporated herein by reference in its entirety.

BACKGROUND

Computers and other electronic systems, for example, digital televisions, digital cameras, and cellular phones, often have one or more memory and other devices to store information. Increasingly, memory and other devices are being reduced in size to achieve a higher density of storage capacity and/or a higher density of functionality. One method of achieving a higher density is to stack devices.

DETAILED DESCRIPTION

The description that follows includes illustrative apparatuses (circuitry, devices, integrated circuit dice, structures, systems, and the like) and methods (e.g., processes, protocols, sequences, techniques, and technologies) that embody the subject matter. In the following description, for purposes of explanation, numerous specific details are set forth in order to provide an understanding of various embodiments of the subject matter. After reading this disclosure however, it will be evident to a person of ordinary skill in the art that various embodiments of the subject matter may be practiced without these specific details. Further, well-known apparatuses and methods have not been shown in detail so as not to obscure the description of the various embodiments.

In order to increase integrated circuit device density within a given area (e.g., a footprint on an electrical device), for example, integrated circuit dice and other device types (e.g., ASICs, boards, cards, controllers, FPGAs, logic, microelectronics packages, microprocessors, modules, peripherals, sensors, systems on chips, etc.) may be stacked on top of one another. One such example includes stacked memory dice, where a number of dice are stacked to increase an overall amount of memory within a given area. Each die in the stack may have a number of integrated circuit devices fabricated on a substrate comprising the die. Some dice within the stack may operate to communicate with other dice in the stack (e.g., slave dice may communicate with a master die to perform their functions). Such stacks may be interconnected from one side of the substrate to the other. The interconnections include through-substrate vias (TSVs). When the substrate comprises silicon, the interconnections may also be referred to as through-silicon vias.

Addressable devices typically make use of a mechanism by which each device (e.g., an integrated circuit die) can be addressed independently from other devices residing on the same bus. Addressable devices used in stacked configurations may provide this capability by assigning each device in the stack a unique device identifier (ID) value. The device ID value may be configured after the assembly process of the stack by providing a serial data input to each device, thereby encoding a unique device ID value. Various embodiments described herein operate to automatically assign a device ID value to each device in a stack of devices. The device ID value may be assigned either during manufacture or at some later time (e.g., if other devices are later added to or removed from the stack).

Various embodiments of the disclosed subject matter include an apparatus for generating a unique device ID value for each addressable device in a multi-device stacked package, such as a stacked-CSP (chip scale package). Generation of the unique device ID value for each stacked device can be accomplished by including circuitry for each addressable device that generates a device ID value based on an input device ID value signal provided to one of the devices in the stack. The disclosed subject matter allows flexible die stacking configuration through data control and latch circuit mechanisms described herein. Further, only one TSV is needed to assign each addressable device a unique device ID value. Since a TSV typically occupies a relatively large area on a device, a person of ordinary skill in the art will immediately recognize advantages in limiting the number of TSVs to a single unit per die to assign the device ID value. Further, TSV yield to connect devices (e.g., die-to-die) is at least partially dependent on the number of TSVs fabricated within the device. As a result, limiting the number of TSVs may improve device yield. However, one or more spare TSVs may be included in the device for purposes of redundancy in case the "single" TSV has been determined to fail or is otherwise unavailable.

To incorporate data transfer through only a single TSV, data input for die configuration may be realized through a defined external serial data input signal, such as a Pulse Width Modulated (PWM) signal. The defined input signal may transfer information regarding device ID value, the total number of devices, and latch timing simultaneously to each of the addressable devices in a stack. Consequently, advantages of the disclosed embodiments include, but are not limited to, configuration flexibility of stacked dice in which the die stacking information may be configured by a single TSV. These elements, and circuitry used to provide the device IDs to devices in the stack, will now be described.

Figure 1:
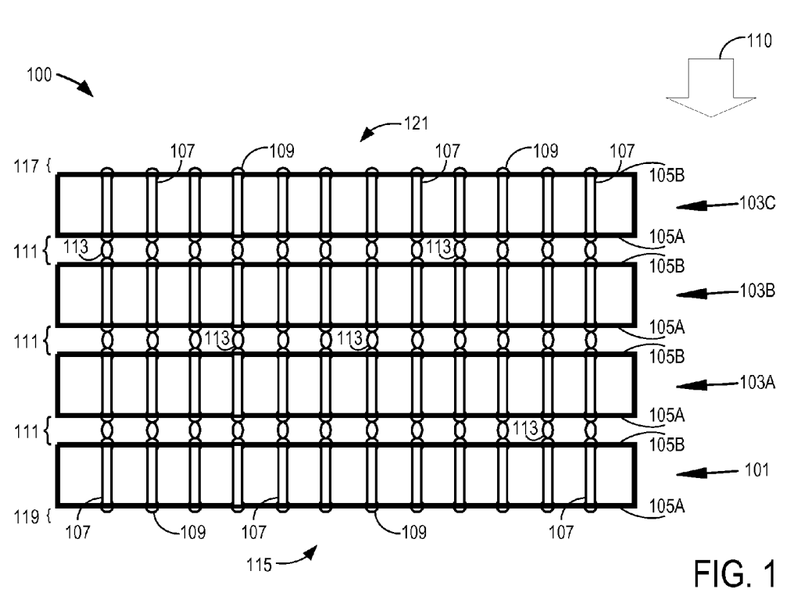
FIG. 1 shows a cross-sectional view of a microelectronics package having a number of stacked and interconnected integrated circuit devices.

Referring now to FIG. 1, a cross-sectional view of a microelectronics package 100 having a number of stacked and interconnected integrated circuit dice, according to various embodiments of the invention, is shown. The stacked and interconnected dice may form at least a portion of a microelectronics package. The microelectronics package 100 is shown to include four integrated circuit dice. In this example, the four integrated circuit dice include a master die 101, and three slave dice 103A, 103B, 103C. The three slave dice 103A, 103B, 103C may be identified individually as the first, the second, and the third slave die, respectively. However, the identification as first, second, and third does not necessarily indicate any type of order or importance and is simply provided for ease in identification throughout descriptions of the various embodiments. Any one or more of the master die 101 or the three slave dice 103A, 103B, 103C may operate with an external serial data input to provide a generated device ID value to other devices, as described herein. In some embodiments, the microelectronics package 100 may contain any other desired number of integrated circuit dice.

Each of the integrated circuit dice has a first surface 105A and a second surface 105B. An arrow 110 indicates a normal orientation of the dice in which the first surface 105A is located at an upper surface of the substrate where the upper surface is generally used during fabrication of integrated circuit devices on the substrate. That is, the upper surface of the substrate is the surface that may be used to form integrated circuit devices on a die. As used herein, relative terms such as lower, upper, under, over, etc. are provided for convenience and brevity of notation, not of limitation, and will be understood by a person of ordinary skill in the art with reference to the figures that are being described.

A number of through-substrate vias (TSVs) 107 are shown on each of the four dice, including the master die 101, and the slave dice 103A, 103B, 103C. The TSVs 107 may also be referred to as through-silicon vias, depending upon the substrate type (e.g., silicon or other elemental semiconductors, compound semiconductors, or other substrate types known in the art, including those used in the formation of device cards) from which the dice are formed. The TSVs 107 may be formed from the first surface 105A through the respective integrated circuit die to the second surface 105B (or alternatively, from the second surface 105B to the first surface 105A). In operation, the TSVs 107 can selectively be connected to certain metallization layers within the die and therefore allow an interconnection from, for example, integrated circuit devices formed on the first surface 105A and through to the second surface 105B of the master die 101, to connect to one or more of the slave dice 103A, 103B, 103C, in the stack. Other types of TSVs may pass only partially through the integrated circuit die. Such a TSV is discussed with reference to FIG. 3, below.

The TSVs 107 may function, for example, electrically, optically, or otherwise. The TSVs 107 allow signals to travel electrically, optically, or otherwise between the master die 101 and various ones of the slave dice 103A, 103B, 103C.

Each of the TSVs 107 has a conductive bonding pad 109 formed on either end or both ends of the TSVs 107. Adjacent ones of the dice are electrically coupled by a conductive electrical connector 113 that is formed (e.g., placed) between the conductive bonding pads. The conductive electrical connector 113 may be, for example, a wirebond, a solder ball, conductive tape, a Controlled Collapse Chip Connection (C4) interconnect, or other suitable electrical connector. The conductive electrical connectors 113 therefore form electrical interconnects 111 between each of the adjacent dice. The conductive bonding pads 109 on the first surface 105A of the master die 101 may be accessible to form an external interface 115. The external interface 115 allows interconnection with other devices such as, for example, a microprocessor. The external interface may be connected to pins (not shown) of the microelectronic package by bonding wires allowing accessibility from outside the package. Similarly, the conductive bonding pads 109 on the second surface 105B of the third slave die 103C form an external slave interface 121 that may be used, for example, to interface with other devices or, alternatively, allow interconnection with other slave dice in a larger stack.

Figure 2:
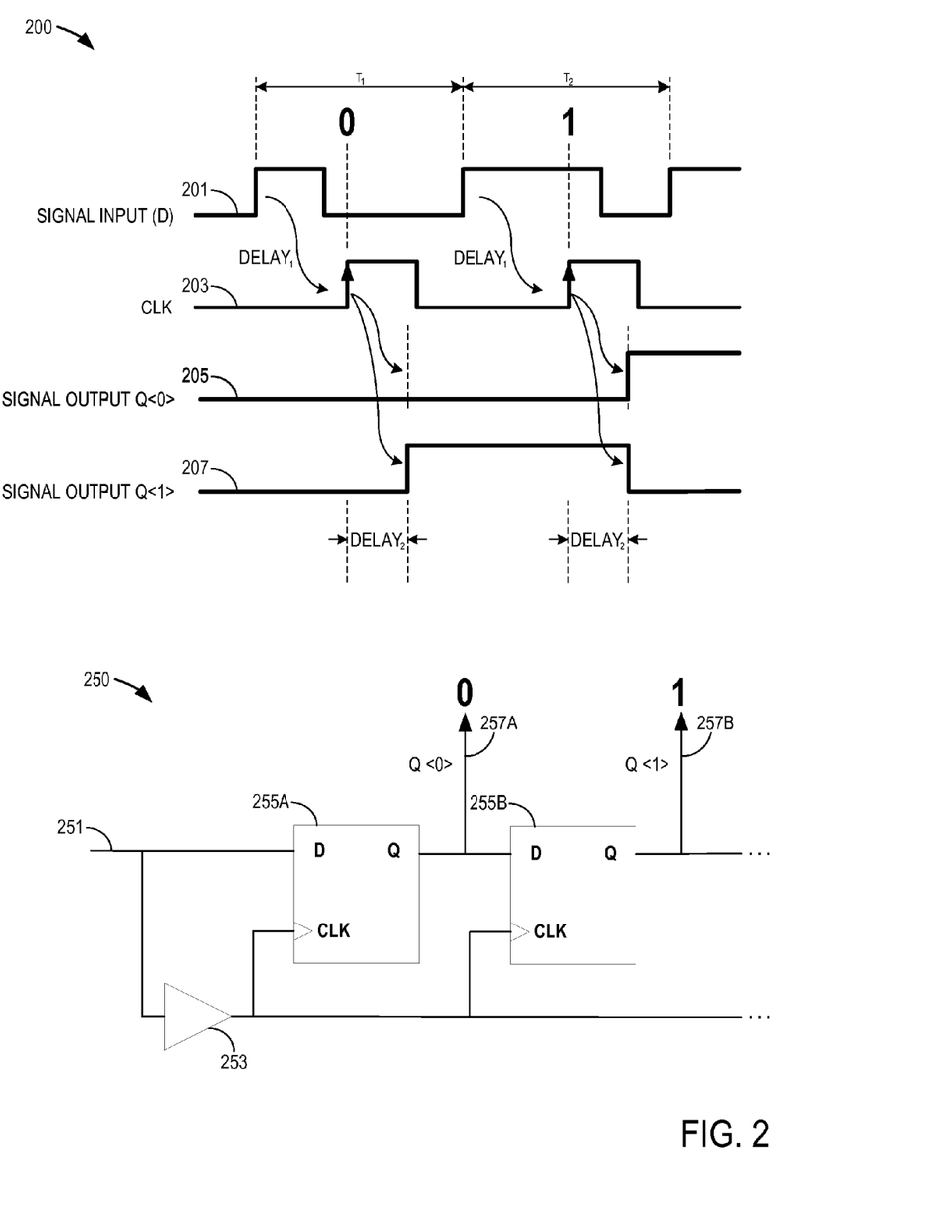
FIG. 2 includes a graph illustrating signal generation, and a schematic diagram of match decode circuitry to provide unique identifier (ID) values to master-slave dice, according to various embodiments of the disclosed subject matter.

FIG. 2 includes a graph 200 illustrating signal generation, and a schematic diagram of match decode circuitry 250 to provide device ID values and total device numbers to master-slave dice, according to various embodiments. FIG. 2 provides a simplified perspective of a one-bit data scheme that may be used with various embodiments of the disclosed subject matter. The graph 200 shows an input signal 201, a clock signal 203, a resultant first output signal Q<0> 205, and a resultant second output signal Q<1> 207. In this embodiment, the input signal 201 is a PWM signal with different signal durations during each time period, $T_1$ and $T_2$.

The match decode circuitry 250 indicates an operation using signals generated during the first time period, $T_1$, of the graph 200. The match decode circuitry 250 is shown to include a signal input line 251, a delay buffer 253, a first flip-flop 255A, and a second flip-flop 255B. Although the match decode circuitry 250 may be implemented with various types of flip-flops (e.g., latches) as indicated, many other types of sequential logic devices may also be employed. The match decode circuitry 250 shown is provided merely as an example in describing the various embodiments disclosed herein and should not be considered as the only workable circuit for the various embodiments.

With concurrent reference now to the graph 200 and the match decode circuitry 250, during the first time period, $T_1$, the input signal 201 is clocked through the signal input line 251 and into the first flip-flop 255A after a delay, $DELAY_1$, through the delay buffer 253 on a first rising edge of the clock signal 203. As indicated by the first resultant output signal Q<0> 205 in the graph 200, the first flip-flop 255A latches a "0" on Q<0> on an output line 257A after a propagation delay, $DELAY_2$, through the first flip-flop 255A. Similarly, the second flip-flop 255B latches a "1" on Q<1> on an output line 257B after a propagation delay, $DELAY_2$, through the second flip-flop 255B (as indicated on the second resultant output signal Q<1> 207).

Referring again to the graph 200, during the second time period, $T_2$, after a second rising edge of the clock signal 203, the first flip-flop 255A latches a "1" after a propagation delay, $DELAY_2$, through the first flip-flop 255A (as indicated on the resultant output signal Q<0> 205). In a similar fashion, after the second rising edge of the clock signal 203, the second flip-flop 255B latches a "0" after a propagation delay, $DELAY_2$, through the second flip-flop 255B (as indicated on the resultant output signal Q<1> 207).

As will become more apparent with reference to FIG. 3 and FIG. 4, below, the principle of a serial one-bit data transfer utilizing, for example, a PWM signal, may be employed to simultaneously send data and latch timing signals through a single TSV. The data latch timing is self-generating by using the delay buffer 253 and the PWM input signal; the delayed CLK latches input data as a short pulse from the input signal 201 being equal to "0" and a long pulse being equal to "1".

Figure 3:
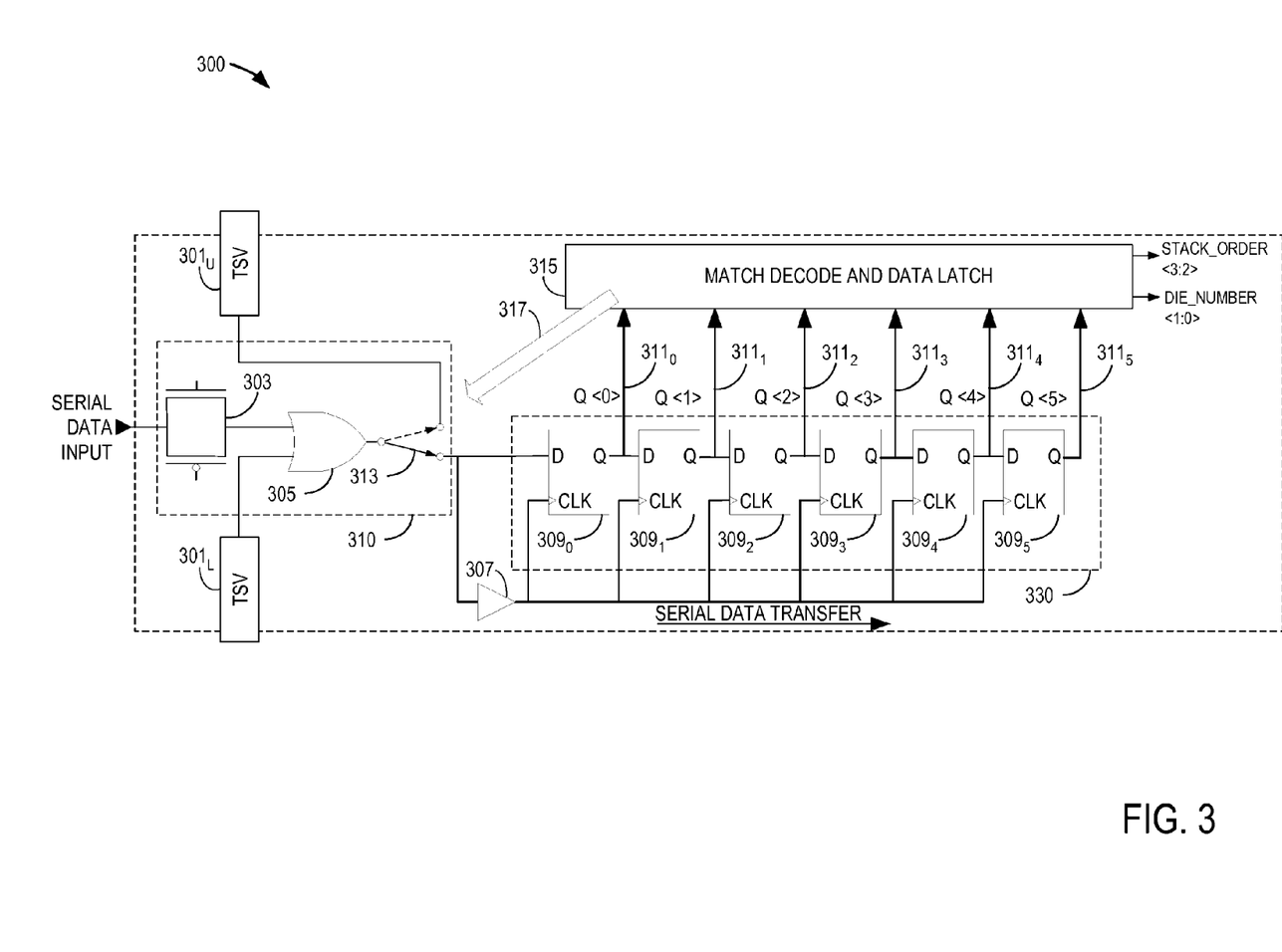
FIG. 3 shows an example of a die including data latch, decode, and switch path circuitry according to an embodiment of the disclosed subject matter.

FIG. 3 shows an example of a die 300 including data latch, decode, and switch path circuitry according to an embodiment of the disclosed subject matter. The die 300 may be either a master die or a slave die, as discussed in more detail with reference to FIG. 4, below. The die 300 is shown to include data input and switch path circuitry 310, a shift register 330, and a match decode and data latch circuit 315.

As shown in FIG. 3, the shift register 330 is implemented as a six-bit serial-in, parallel-out shift register. However, other types of registers may be implemented as well. Each of the flip-flops $309_0, 309_1, \ldots, 309_5$ has an associated output path $311_0, 311_1, \ldots, 311_5$. FIG. 3 also shows a lower TSV $301_L$, an upper TSV $301_U$, and a delay buffer 307. The TSVs $301_L, 301_U$ are configured to couple to adjacent addressable dice (shown in more detail in FIG. 4 and may include a first adjacent addressable device (e.g., a die) above the die 300 and a second adjacent addressable device below the die 300) and may be similar or identical to the TSV of FIG. 1. The lower TSV $301_L$ may be considered as an input TSV and the upper TSV $301_U$ may be considered as an output TSV. Although a person of ordinary skill in the art will understand that electrical communication may be bidirectional within a TSV, the terms "input" and "output" are provide merely as an aid to better understand the concepts presented herein. The delay buffer 307 may be similar or identical to the delay buffer 253 of FIG. 2.

The data input and switch path circuitry 310 includes a pass gate 303 coupled to receive a serial data input, discussed below, an equivalent OR gate 305 (e.g., one or more combinatorial logic devices having an output function equivalent to an OR gate), and a switch 313. The OR gate 305 performs an OR operation from an input received from the serial data input passed by the pass gate 303 and the lower TSV $301_L$ as indicated by Table I, below.

TABLE I

| Input: TSV $301_L$ | Serial Data Input Value | Output: OR Gate 305 |
|---|---|---|
| 0 | 0 | 0 |
| 0 | 1 | 1 |

For the purpose of this discussion, one may assume that the die 300 is the master die in a stack with no die coupled to the lower TSV $301_L$. With no die coupled to the lower TSV $301_L$, the value of the TSV $301_L$ on the side coupled to the OR gate 305 is "0" (or, alternatively, the lower TSV $301_L$ may be tied to a logic low level since it is not connected to another die). Therefore, the output of the OR gate 305 is entirely dependent on the value of the serial data input to the pass gate 303, as indicated by Table I. Thus, the output of the OR gate 305 in this embodiment will always be the same as the value of the serial data input provided to the pass gate 303.

Initially, the switch 313 may couple the serial data input to the shift register 330 when the switch 313 is in the "lower" position as indicated by the solid line.

The function of the serial data input will now be described. In one example, the serial data input provides a device ID value to each addressable device (e.g., die) in a stack. The serial data input may include one or more die information number bits, DieNumber, indicating the total number of dice in the stack one or more stack order identifier bits, StackOrder, to uniquely identify each of the dice, and one or more match signal information bits, MatchSignal, to change an internal input path (e.g., through the switch 313) in the die stack.

In an example of the serial data input serially-shifted into the shift register 330, for a four-die stack, a six-bit data string may be used. DieNumber can be sent to stacked devices in the last two-bits (Q<1:0>) of the serial data input, StackOrder is sent as the middle two-bits (Q<3:2>) of the serial data input, and the MatchSignal generator information is sent as the first two-bits (Q<5:4>) of the serial data input. In other examples, a single bit may be used for the match signal.

As will be described in more detail below, the MatchSignal generator value sends information to the switch 313 when the DieNumber and the StackOrder have been latched into the match decode and data latch circuit 315. Thus, if the signal data input is generated such that bit values for locations Q<5:4> equals <1:1>, respectively, then a signal 317 is provided to the switch 313 to switch to the upper position (the dashed line of the switch 313) completing the data latch information for the die 300 and directing the serial data input to an upper die (not shown in FIG. 3) through the upper TSV $301_U$. Consequently, the six-bit serial data input can be realized as shown in Table II, below.

TABLE II

| Serial Data Input Bit Location | Latch Identifier |
|---|---|
| Q<1:0> | DieNumber Information |
| Q<3:2> | Die StackOrder Information |
| Q<5:4> | MatchSignal Generator Information |

In this example with four-dice in a stack, all dice will have DieNumber designated by values of <1:1>. For a stacked arrangement such as the microelectronics package 100 as shown in FIG. 1, the master die 101 may have the StackOrder provided by the middle two-bits (Q<3:2>) as a value of <0:0>, the first slave die 103A StackOrder is a value of <0:1>, the second slave die 103B StackOrder is a value of <1:0>, and the third slave die 103C StackOrder is a value designated by values of <1:1>. However, only one of the TSVs 107 shown in FIG. 1 needs to be used to assign device ID values to each die; the other TSVs 107 may be used for other purposes, such as general communications between the dice.

The values of StackOrder and DieNumber are then latched "permanently" by the match decode and data latch circuit 315. However, the process may be started over again should the total number of dice or the order of dice in the stack change. Such an example of a changed number of dice is described in more detail with reference to FIG. 5 where a die has failed. For example, an electrical fuse may be used for the latch (including in some examples, various redundancies). This scheme may also be used to latch die stacking information. Consequently, a do pre-test may be performed for all stacking configuration related testing before "permanently" storing data in a die. Reconfiguration is also available if a decision is made to change the stacking information as explained herein.

Consequently, six-bits can be used to provide unique ID values to four addressable devices. Based on reading and understanding the disclosure provided herein, a person of ordinary skill in the art will readily understand how to extrapolate the disclosed subject matter to any number of dice in a stack.

For example, the master die 101 and the slave dice 103A 103B, 103C are shown for a four-die stack, implemented with a six-bit serial data input, larger or smaller numbers of dice may be used with other circuit and/or serial data input arrangements. For example, in a particular embodiment of the disclosed subject matter, a single bit may be used to indicate a respective device ID value for a two-die stack, "0" and "1," representing ID (0) and ID (1). The two-die stack may be implemented with, for example, a three-bit data input having one bit each for the DieNumber, StackOrder, and MatchSignal values. The shift register may then be implemented with three flip-flops.

In other embodiments, three or more bits may be used to indicate a device ID value. For example, three bits may be used to indicate a respective unique device ID value for up to each of eight addressable devices (e.g., integrated circuit dice), "000," "001," "010," "011," "100," "101," "110," and "111." That is, $base_{10}$ numbers 0 through 7, representing ID (0) through ID (7). In one example of the up to eight-die stack, a seven-bit serial data input having three bits each for the DieNumber and StackOrder values, and a single bit for the MatchSignal generator values may be used. The shift register may then be implemented with seven flip-flops.

The examples described above are provided to enable a person of ordinary skill in the art to understand the concepts of the disclosed subject matter. However, various changes may be readily implemented and still be within a scope of the subject matter. For example, although six bits are described as one example of providing a unique ID value to each die in a four die-stack, larger or smaller numbers of bits in a data input can be used to provide the identifier value as well. Also, other forms of sequential or combinatorial logic devices may readily be implemented as well. Therefore, the described circuits and data inputs are provided merely for ease in understanding one implementation of the subject matter, and not of limitation.

For example, the number of bits used to indicate the device ID value (N) is at least partially dependent upon a maximum number of addressable devices in the stack. For example, if there are two addressable devices in a stack, a single bit device ID value is sufficient (N=0, 1). If there are between two and four addressable devices in the stack, a two-bit device ID value may be used (N=0, 1, 2, 3). The maximum number of addressable devices in the stack should be less than or equal to $2^M$, where M is the number of bits. For example, a three-bit device ID value can accommodate up to eight dice (e.g., $2^3$, where M=3) in the stack.

If a single bit is used for the MatchSignal generator value, then, in general, various embodiments may be implemented with 2N+1 signal data bits and 2N+1 flip-flops. Thus, with two addressable devices in the stack (the device ID value N=1), 2(1)+1=3, so three signal data bits and three flip-flops may be used to assign device ID values to two addressable devices. With up to four addressable devices in the stack (the device ID value N=2), 2(2)+1=5, so five signal data bits and five flip-flops may be used to assign device ID values to up to four addressable devices. With up to eight addressable devices in the stack (the device ID value N=3), 2(3)+1=7, so seven signal data bits and seven flip-flops may be used to assign device ID values to up to eight addressable devices. Therefore, any number of addressable devices may have a unique ID value assigned utilizing only a single TSV. In other embodiments, if x bits are used for the MatchSignal generator value, then, in general, various embodiments may be implemented with 2N+x signal data bits and 2N+x flip-flops.

Figure 4:
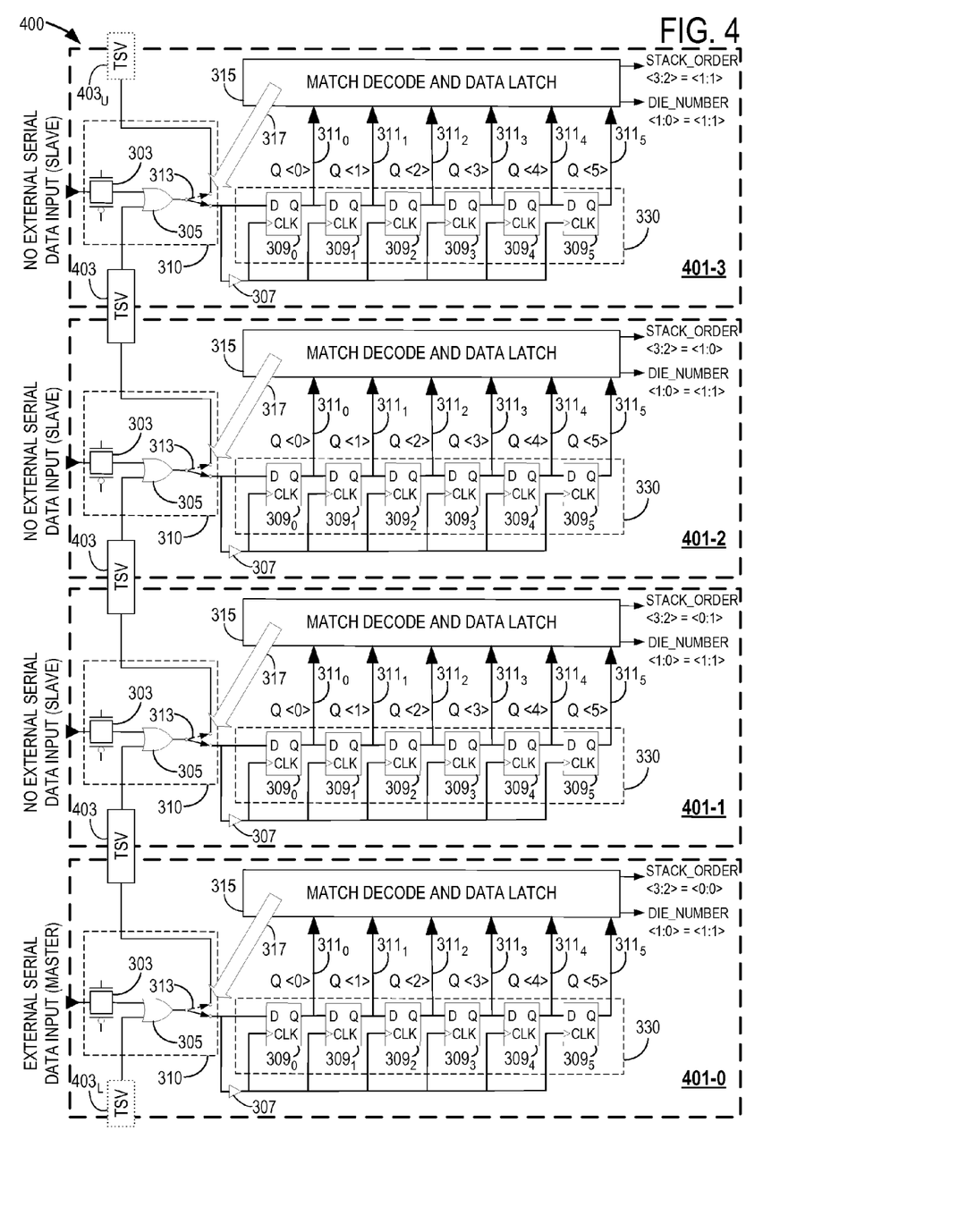
FIG. 4 shows a schematic of a stacked package having four stacked and interconnected integrated circuit dice and incorporating embodiments of the disclosed subject matter.

To more fully understand the disclosed subject matter in a stack with multiple dice, FIG. 4 shows a schematic of a stacked package 400 having four stacked and interconnected integrated circuit dice 401-0, 401-1, 401-2, 401-3 arranged adjacent to one another. In the stacked package 400, the first integrated circuit die 401-0, may be considered to be the master die. Each of the other dice, 401-1, 401-2, 401-3, may be considered to be slave dice for this example. A number of TSVs 403 provide electrical interconnects between each of the dice 401-0, 401-1, 401-2, 401-3. The first die 401-0 has a lower TSV $403_L$ that, in this example, is not connected to any other die since the first die 401-0 is the lower-most die in the stacked package 400. Similarly, the fourth die 401-3 has an upper TSV $403_U$ that is not connected to any other die since the fourth die 401-3 is the upper-most die in the stacked package 400.

As indicated, the only die that is coupled to an external source from which the external serial data input is received is the first die 401-0. None of the subsequent other dice, 401-1, 401-2, 401-3, receive an external serial data input as the device ID value is provided from a die lower in the stacked package once the lower die is switched, as described below.

For example, assume a serial data input is clocked into the shift register 330 of the first die 401-0. Following the convention for the values of DieNumber (Q<1:0>), StackOrder (Q<3:2>), and MatchSignal (Q<5:4>) described above, the following values may be used for configuring the first die in a four-die stack:

DieNumber=<1:1>;
StackOrder=<0:0>; and
MatchSignal=<1:1>.

Once the MatchSignal=<1:1> is latched into the match decode and data latch circuit 315 of the first die 401-0, the signal 317 is sent to the switch 313 directing all further serial data inputs through the TSV 403 to the second die 401-1. Since there is no data input to the pass gate 303 of the second die 401-1, the portion of the OR gate 305 coupled to the pass gate 303 is "0." Therefore, as described above with reference to Table 1, since one portion of the OR gate 405 is low (at a value of "0"), the output of the OR gate 305 is entirely dependent on the value of the serial data input passed from the first die 401-0 through the TSV 403 to the second die 401-1.

The serial data input is now clocked into the shift register 330 of the second die 401-1. Similar to the operation described above with regard to the first die 401-0, the following values may be used for configuring the second die in the four-die stack:

DieNumber=<1:1>;
StackOrder=<0:1>; and
MatchSignal=<1:1>.

Again, once the MatchSignal=<1:1> is latched into the match decode and data latch circuit 315 of the second die 401-1, the signal 317 is sent to the switch 313 directing all further serial data inputs to the third die 401-2, where the third die then receives a StackOrder value of <1:0>.

The operation again repeats with the fourth die 401-3 receiving a StackOrder value of <1:1>. After the fourth die 401-3 has the DieNumber=<1:1>, StackOrder=<1:1>, and MatchSignal=<1:1> values latched into the match decode and data latch circuit 315, the signal 317 directs the switch 313 of the fourth die 401-3 to the upper position (e.g., directing further serial data inputs to the upper TSV $403_U$). Since there is no additional die located above the fourth die 401-3, the operation of assigning ID values to each of the dice 401-0, 401-1, 401-2, 401-3 in the stacked package 400 is completed.

Each of the dice 401-0, 401-1, 401-2, 401-3 can have ID values reassigned if desired. For example, by providing different inputs strings to the serial data input, the second die 401-1 and the third die 401-2 can each have their stack order values reassigned as <1:0> and <0:1>, respectively. Thus, the StackOrder is selectable for all dice dependent on the values provided to the serial data input. In various examples, an internal power-on-reset signal and/or an external reset pin may be used to generate an all-circuit initialize signal to reset the switches 313 to re-assign values if desired. Further, should one of the dice in the stack fail, the ID values can be assigned differently. Such an operation is described in detail with reference to FIG. 5, below.

Figure 5:
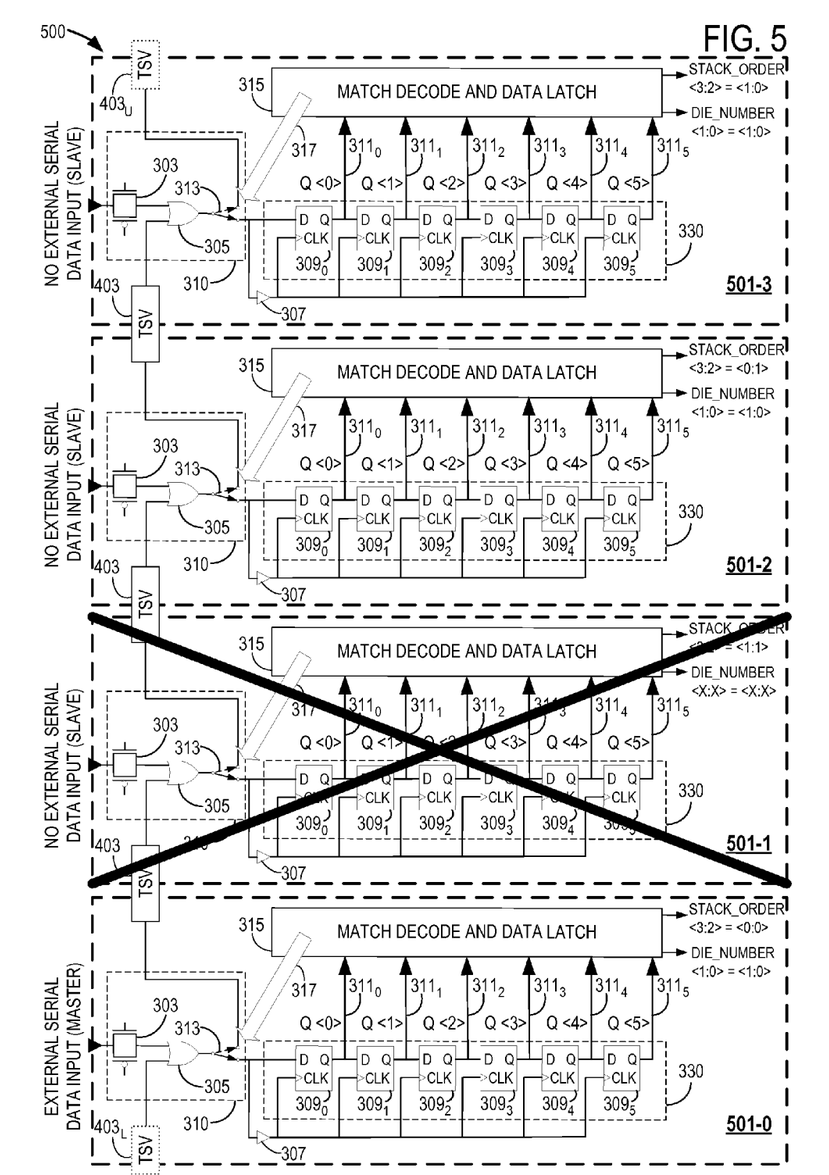
FIG. 5 shows a schematic of a stacked package having four stacked and interconnected integrated circuit dice, including one failed die, and incorporating embodiments of the disclosed subject matter.

FIG. 5 shows a schematic of a stacked package 500 having four stacked and interconnected integrated circuit dice 501-0, 501-1, 501-2, 501-3, including one failed die 501-1. In this example, components of the failed die 501-1, other than the circuits described for assigning unique ID values to the dice, failed after the stacked package 500 was assembled.

Similar to operations described above with reference to FIG. 4, assume a serial data input is clocked into the shift register 330 of the first die 501-0. Following the convention for the DieNumber (Q<1:0>), StackOrder (Q<3:2>), and MatchSignal (Q<5:4>) described above, the following values may be used to configure the first die in a four-die stack:
DieNumber=<1:0>;
StackOrder=<0:0>; and
MatchSignal=<1:1>.

Since the second die 501-1 is a failed die, the DieNumber=<1:0> reflects the number of functional dice in the stacked package 500. The total number of functional dice is three.

Once the MatchSignal=<1:1> is latched into the match decode and data latch circuit 315 of the first die 501-0, the signal 317 is sent to the switch 313 directing all further serial data inputs to the second die 501-1. However, since the second die 501-1 has failed, no unique device ID value is assigned. Thus, only the MatchSignal value is latched into the match decode and data latch circuit 315 of the second die 501-1 as shown:
DieNumber=<X:X>;
StackOrder=<1:1>; and
MatchSignal=<1:1>;
where "X" is a "don't care" condition (e.g., the value can be either "0" or "1") since the exact ID value "assigned" to the failed die 501-1 will not be used to address the die. The StackOrder=<1:1> may be used to indicate that the second die 501-1 is failed or otherwise unavailable since there are only three functional dice in the stack. Other indications that second die 501-1 is failed may be used as well (e.g., an invalid DieNumber such as <0:0>).

When the MatchSignal=<1:1> is latched into the match decode and data latch circuit 315 of the second die 501-1, the signal 317 is sent to the switch 313 directing all further serial data inputs to the third die 501-2, where the third die then receives a StackOrder value of <0:1> since it is the second die that is functional in the stacked package 500 (the second "physical" die 501-1 being a failed die). The operation again repeats with the fourth die 501-3 (the third functional die) receiving a StackOrder value of <1:0>.

Figure 6:
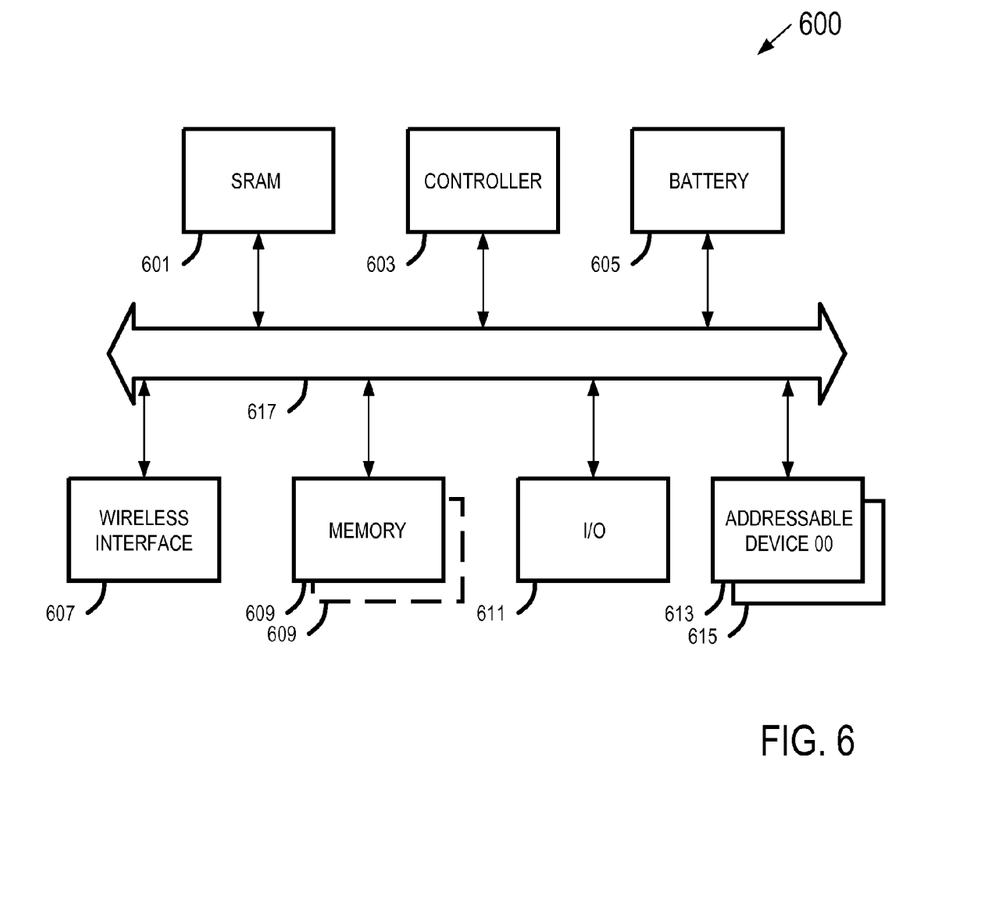
FIG. 6 is a block diagram of a system embodiment, including a memory device and an addressable device having stacked dice.

With reference now to FIG. 6, a block diagram of an illustrative embodiment of an apparatus in the form of a system 600 including one or more memory devices 609 is shown. The memory devices 609 may comprise stacked integrated circuit dice, as discussed above. The system 600 may be used in devices such as, for example, a personal digital assistant (PDA), a laptop or portable computer with or without wireless capability, a web tablet, a wireless telephone, a pager, an instant messaging device, a digital music player, a digital camera, or other devices that may be adapted to transmit or receive information either wirelessly or over a wired connection. The system 600 may be used in any of the following systems: a wireless local area network (WLAN) system, a wireless personal area network (WPAN) system, or a cellular network.

The system 600 of FIG. 6 is shown to include a controller 603, an input/output (I/O) device 611 (e.g., a keypad, a touchscreen, or a display), a memory device 609, a wireless interface 607, a static random access memory (SRAM) device 601, a first addressable device 613, and a second addressable device 615, coupled to each other via a bus 617. A battery 605 may supply power to the system 600 in one embodiment. The memory device 609 may include a NAND memory, a flash memory, a NOR memory, a combination of these, or the like. The memory device 609 may include a stacked memory device having unique ID values assigned as described herein.

The controller 603 may include, for example, one or more microprocessors, digital signal processors, micro-controllers, or the like. The memory device 609 may be used to store information transmitted to or by the system 600. The memory device 609 may optionally also be used to store information in the form of instructions that are executed by the controller 603 during operation of the system 600 and may be used to store information in the form of user data either generated, collected, or received by the system 600 (such as image data). The instructions may be stored as digital information and the user data, as disclosed herein, may be stored in one section of the memory as digital information and in another section as analog information. As another example, a given section at one time may be labeled to store digital information and then later may be reallocated and reconfigured to store analog information. The controller 603 may include one or more of stacked devices as described herein.

The I/O device 611 may be used to generate information (e.g., such as the serial data input described herein). The system 600 may use the wireless interface 607 to transmit and receive information to and from a wireless communication network with a radio frequency (RF) signal. Examples of the wireless interface 607 may include an antenna, or a wireless transceiver, such as a dipole antenna. However, the scope of the inventive subject matter is not limited in this respect. Also, the I/O device 611 may deliver a signal reflecting what is stored as either a digital output (if digital information was stored), or as an analog output (if analog information was stored). While an example in a wireless application is provided above, embodiments of the inventive subject matter disclosed herein may also be used in non-wireless applications as well. The I/O device 611 may include one or more of the novel stacked devices described herein.

Further, various embodiments described in the figures can be included as part of various ones of the devices on the bus 617 of FIG. 6. For example, each of the memory devices 609, as well as the first addressable device 613 and the second addressable device 615, may include one or more addressable dice or other devices having a unique ID value, such as the integrated circuit dice 401-0, 401-1, 401-2, 401-3 of FIG. 4.

The various illustrations of the procedures and apparatuses are intended to provide a general understanding of the structure of various embodiments and are not intended to provide a complete description of all the elements and features of the apparatuses and methods that might make use of the structures, features, and materials described herein. Base upon reading and understanding of the disclosed subject matter provided herein, a person of ordinary skill in the art can readily envision other combinations and permutations of the various embodiments. The additional combinations and permutations are all within a scope of the present invention.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An apparatus, comprising:
   a first through-substrate via (TSV) coupled to an addressable device of the apparatus;
   a second TSV coupled to the addressable device of the apparatus, at least one of the first TSV and the second TSV configured to provide to, or to receive from, one or more unique device identifier values to subsequent, or from preceding, addressable devices, respectively, to be coupled to the apparatus;
   a switch including a first node a second node, the second node being coupled either to a unique device identifier circuit or to the second TSV, the switch being controllable by the unique device identifier circuit and configured to switch between the unique device identifier circuit and the second TSV in response to a control signal received from the unique device identifier circuit; and
   an equivalent OR gate having a first node, a second node, and a third node, the first node being coupled to the first TSV, the second node being coupled to the first node of the switch, and the third node being coupled to receive an externally-generated serial data input signal.

2. The apparatus of claim 1, wherein the unique device identifier circuit includes a shift register coupled to the switch.

3. The apparatus of claim 2, further comprising a latch circuit configured to latch data of the shift register.

4. The apparatus of claim 3, wherein the data includes a unique device identifier value.

5. The apparatus of claim 3, wherein the shift register includes:
   a plurality of latch circuits coupled in series, a first latch circuit of the latch circuits being coupled to the switch to receive the data via the switch from the first TSV; and
   a delay buffer including an input coupled to the switch, the delay buffer further including an output coupled to each of the plurality of the latch circuits.

6. The apparatus of claim 5, wherein, based on a determination that predetermined data are latched in the latch circuit, the latch circuit being configured to output the control signal to the switch.

7. An apparatus, comprising:
   a first semiconductor die having a first through-substrate via (TSV) and a second TSV, a switch including a first node, a second node, and a third node, and an internal circuit, the first node being couplable to either the first TSV or a serial data input, the second node being coupled to the internal circuit, the switch being configured to receive a control signal from the internal circuit to activate one of a first electrical path and a second electrical path, the first electrical path being between the first node and the second node and the second electrical path being between the first node and the third node; and
   a second semiconductor die having a third TSV, the third TSV being coupled to the third node of the switch of the first semiconductor die.

8. The apparatus of claim 7, wherein the switch is configured to activate the first electrical path responsive to a first state of the control signal and the second electrical path responsive to a second state of the control signal.

9. The apparatus of claim 7, wherein the first semiconductor die and the second semiconductor die are stacked with each other.

10. The apparatus of claim 7, wherein the internal circuit comprises a register circuit configured to store data supplied from the first TSV when the first electrical path is activated.

11. An apparatus, comprising:
    a first through-substrate via (TSV),
    a terminal;
    an internal circuit; and
    a switch including a first node couplable to either the first TSV or a serial data input, a second node coupled to the internal circuit, and a third node coupled to the terminal, the switch being configured to receive a control signal to activate one of a first electrical path and a second electrical path, the first electrical path being between the first node and the second node and the second electrical path being between the first node and the third node.

12. The apparatus of claim 11, further comprising a second TSV coupled to the terminal.

13. The apparatus of claim 12, further comprising a first die and a second die, the first die including the first TSV, the terminal, the internal circuit, and the switch, and the second die including the second TSV, the first die and the second die each being addressable devices.

14. The apparatus of claim 11, wherein the internal circuit comprises a shift register and a control circuit coupled to the shift register to produce the control signal.

15. The apparatus of claim 11, wherein the internal circuit includes a shift register, the shift register comprising:
    a plurality of latch circuits coupled in series to one another, a first latch circuit of the latch circuits coupled to the second node of the switch; and
    a delay buffer including an input coupled to the second node and an output coupled to each of the plurality of latch circuits.

16. The apparatus of claim 15, further comprising a latch circuit configured to latch data on the shift register, the data including a first portion corresponding to a unique device identifier value.

17. The apparatus of claim 16, wherein the data includes a second portion to produce the control signal.

18. The apparatus of claim 11, the apparatus further comprising an equivalent OR gate including a first input coupled to the first TSV, a second input coupled to serial data input, and an output coupled to the first node of the switch.

* * * * *